United States Patent
Shin et al.

[11] Patent Number: 6,087,264
[45] Date of Patent: Jul. 11, 2000

[54] METHODS FOR PATTERNING MICROELECTRONIC STRUCTURES USING CHLORINE AND OXYGEN

[75] Inventors: Hwa-sook Shin; Kyeong-koo Chi, both of Kyungki-do; Chan-ouk Jung, Seoul, all of Rep. of Korea

[73] Assignee: Samsung Electronics Co., Ltd., Rep. of Korea

[21] Appl. No.: 08/782,305

[22] Filed: Jan. 15, 1997

[30] Foreign Application Priority Data

May 15, 1996 [KR] Rep. of Korea ............... 96-16264

[51] Int. Cl.⁷ ............................................. H01L 21/3056
[52] U.S. Cl. ..................... 438/706; 438/710; 438/711; 438/712; 438/714
[58] Field of Search ........................... 438/706, 710, 438/714, 711, 712, 715, 719, 720, 721; 156/643.1; 216/67, 72

[56] References Cited

U.S. PATENT DOCUMENTS

| | | | |
|---|---|---|---|
| 4,478,678 | 10/1984 | Watanabe | 156/643 |
| 4,490,209 | 12/1984 | Hartman | 156/643 |
| 4,543,597 | 9/1985 | Shibata | 357/23.6 |
| 4,615,764 | 10/1986 | Bobbio et al. | 156/643 |
| 4,789,426 | 12/1988 | Pipkin | 156/643 |
| 5,134,085 | 7/1992 | Gilgen et al. | 437/52 |
| 5,160,407 | 11/1992 | Latchford et al. | 156/656 |
| 5,219,485 | 6/1993 | Wang et al. | 252/79.3 |
| 5,705,433 | 1/1998 | Olson et al. | 437/233 |
| 5,716,495 | 2/1998 | Butterbaugh et al. | 156/643.1 |
| 5,741,396 | 4/1998 | Loewenstein | 156/643.1 |

FOREIGN PATENT DOCUMENTS

| | | | |
|---|---|---|---|
| 63-119533 | 5/1988 | Japan | H01L 21/302 |
| 2-84723 | 3/1990 | Japan | H01L 21/302 |
| 2-94520 | 4/1990 | Japan | H01L 21/302 |
| 3-241829 | 10/1991 | Japan | H01L 21/302 |

OTHER PUBLICATIONS

Wolf, S. et al., *Silicon Processing for the VLSI Era, vol. 1—Process Technology*, p. 192.

S.M. Sze, *VLSI Technology*, Second Edition, McGraw–Hill Press, 1988, pp. 200–204.

*Primary Examiner*—Benjamin L. Utech
*Assistant Examiner*—Lan Vinh
*Attorney, Agent, or Firm*—Myers Bigel Sibley & Sajovec

[57] ABSTRACT

A method for forming a gate structure on a semiconductor substrate includes the following steps. A layer of a gate material is formed on the semiconductor substrate, and a patterned mask layer is formed on the layer of the gate material opposite the substrate. The layer of the gate material is then etched with an etching gas including a mixture of chlorine gas ($Cl_2$) and oxygen gas ($O_2$) using the patterned mask layer as an etching mask. In particular, the step of forming the layer of the gate material can include the steps of forming a polysilicon layer on a surface of the semiconductor substrate, and forming a silicide layer on the polysilicon layer opposite the substrate.

10 Claims, 6 Drawing Sheets

METHODS FOR PATTERNING MICROELECTRONIC STRUCTURES USING CHLORINE AND OXYGEN

FIELD OF THE INVENTION

The present invention relates to the field of microelectronics and more particularly to methods for patterning microelectronic structures.

BACKGROUND OF THE INVENTION

As the integration densities of semiconductor devices continue to increase, the widths of gate electrodes are generally reduced. As the width of a conventional doped polysilicon gate electrode approaches 0.25 microns ($\mu$m), however, its performance may deteriorate. In particular, as the resistance of the polysilicon gate increases with the reduction of the width, the transmission of a gate signal may thus be delayed. Furthermore, when a sufficiently narrow polysilicon gate is used in a p-MOS transistor, short channel effects may increase because of the buried channel formed to lower the threshold voltage.

In order to reduce the effects of the above mentioned problems, the formation of gate electrodes from a conductive material having a relatively low resistivity and a work function corresponding to the midgap of silicon have been investigated. In particular, it has ben noted that a polycide structure formed from a silicide (a compound formed of metal and silicon which are heat-treated) and polysilicon can be used as a gate electrode material in place of a doped polysilicon structure.

The polycide structure can include tungsten silicide (WSix) or titanium silicide (TiSix) as the silicide. Alternately, a silicide including a metal having a relatively high melting point, such as a cobalt silicide (CoSix) for example, can be used. Of the above mentioned silicides, titanium silicide (hereinafter referred to as TiSix) excels in thermal stability and has a relatively low resistivity which is about one quarter that of tungsten silicide (WSix). TiSix is thus considered a very suitable material for a gate electrode, and in particular for a gate electrode for a device such as a dynamic random access memory (DRAM) with a memory capacity of over 1 gigabit.

FIGS. 1A to 1C are views illustrating steps of a method for forming a gate having a Ti-polycide structure, according to the prior art. As shown in FIG. 1A, a gate oxide layer 4 is formed on the surface of a semiconductor substrate 2, and a conductive polysilicon layer 6 is formed on the gate oxide layer. A titanium layer is then deposited on the polysilicon layer 6, and this structure is heat-treated so that the polysilicon and titanium react with each other to form a titanium silicide (TiSix) layer 8. Alternately, the titanium silicide (TiSix) layer can be directly deposited on the polysilicon layer 6 using a sputtering or other technique.

An insulating layer 10 can be formed by depositing a layer of silicon oxide or silicon nitride on the titanium silicide (TiSix) layer 8, as shown in FIG. 1A. A patterned photoresist layer 12 is then formed on the insulating layer to define the gate pattern, and this photoresist layer can be patterned using conventional photolithographic techniques, as shown in FIG. 1B. The insulating layer 10, the titanium silicide layer 8, and the polysilicon layer 6 are then sequentially etched using the patterned photoresist layer 12 as an etching mask, as shown in FIG. 1C. A gate structure having a polycide structure including the titanium silicide layer 8 and the polysilicon layer 6 can thus be provided.

The titanium silicide and polysilicon layers which make up the gate pattern can be etched using a dry etching technique. In particular, a fluorine-series gas (e.g., sulfur hexafluoride $SF_6$ or carbon tetrafluoride $CF_4$), a chlorine-series gas (e.g., hydrogen chloride HCl, chlorine gas $Cl_2$ or boron trichloride $BCl_3$), and/or hydrogen bromide HBr can be used as the etching gas. The TiSix layer 8 and the polysilicon layer 6, however, may be susceptible to sidewall erosion during the etch. This sidewall erosion of the gate structure may cause a bridge to form between conductive layers due to a stringer phenomenon wherein a conductive material remains at the eroded portion after the next processing step (e.g., a pad electrode formation step). The reliability of the semiconductor device may thus be decreased and product yield reduced.

The gate oxide layer may also be damaged because fluorine-series gasses and boron trichloride ($BCl_3$) have low etching selectivities with respect to the oxide. In addition, when hydrogen bromine (HBr) is used as the etching gas, it may react with the TiSix layer 8 to produce a significant amount of polymer (i.e., a non-volatile residue) which may remain between the gate electrodes being patterned making it difficult to adjust the critical dimension thereof. Furthermore, when only chlorine gas ($Cl_2$) is used as the etching gas with a hard mask instead of photoresist, severe sidewall erosion may occur.

SUMMARY OF THE INVENTION

It is therefore an object of the present invention to provide improved methods for forming gate electrode structures.

It is another object of the present invention to provide methods for forming gate electrode structures which can have reduced resistivity.

It is still another object of the present invention to provide methods for forming gate electrode structures which can have reduced residue between gate electrodes.

It is yet another object of the present invention to provide methods for forming gate electrode structures which can reduce sidewall erosion thereof.

These and other objects are provided according to the present invention by methods including the steps of forming a layer of a gate material on a semiconductor substrate, forming a patterned mask layer on the gate material, and etching the layer of the gate material with an etching gas including a mixture of chlorine gas ($Cl_2$) and oxygen gas ($O_2$) while using the patterned mask layer as an etching mask. The step of forming the layer of the gate material can include forming a polysilicon layer on the semiconductor substrate, and forming a silicide layer on the polysilicon layer opposite the substrate. The use of the etching gas mixture including chlorine gas and oxygen gas can thus improve the profile of the resulting gate electrodes and reduce residue between gate electrodes. In particular, etch byproducts may serve as a protective film on the gate electrode sidewalls thereby reducing sidewall erosion.

The oxygen gas is preferably mixed with the chlorine gas at a ratio of 10% to 30% of the etching gas. The step of etching the gate material can be performed using a bias power of at least 150 W at a temperature of at least 0° C. Alternately, the step of etching the gate material can be performed using a bias power of at least 200 W at a temperature of at least 0° C. Furthermore, the step of forming the layer of the gate material can be preceded by the step of forming an insulating layer on the substrate.

Accordingly, the methods of the present invention can be used to provide gate electrode structures having reduced resistivity, reduced sidewall erosion, and reduced residue.

DETAILED DESCRIPTION

Figure 1A:
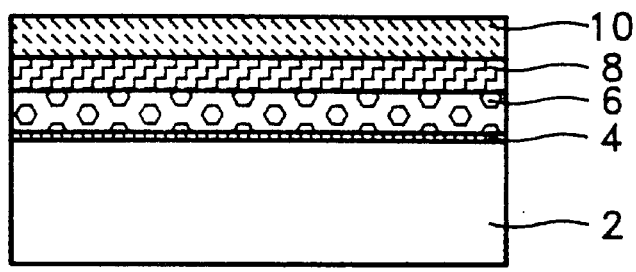
FIGS. 1A to 1C are cross-sectional views illustrating steps of a method for forming a gate electrode having a polycide structure according to the prior art.
Figure 1B:
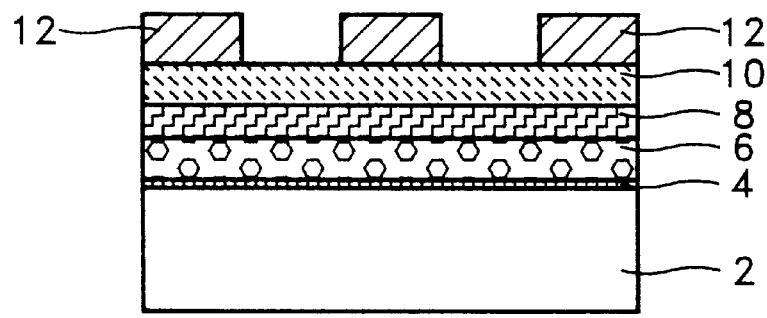
Figure 1C:
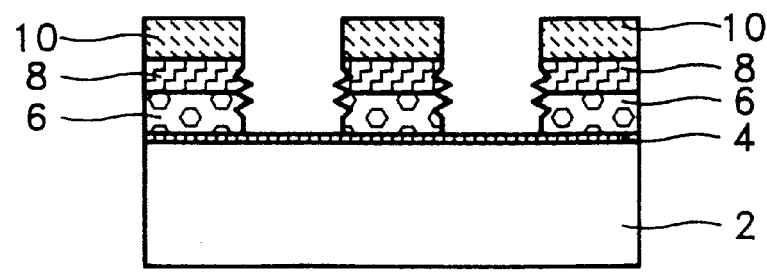

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

The present invention relates to improved methods for forming polycide gate structures. The methods of the present invention allow the formation of polycide gate structures with reduced sidewall erosion and reduced residue generation. In particular, when dry etching a Ti-polycide layer to form a Ti-polycide gate electrode according to the present invention, oxygen gas O$_2$ is added to chlorine gas Cl$_2$ during the dry etch to reduce sidewall erosion. Additional etch parameters are discussed in greater detail below. For example, the dry etch used to form the gate electrodes of the present invention can be performed at a pressure of 2 mTorr while maintaining the temperature at a normal level.

The following formulas illustrate the chemical reactions which occur when etching titanium silicide using a gas mixture including Cl$_2$ and O$_2$:

$$\text{TiSix} + \text{Cl}_2 \rightarrow \text{TiCl}_x, \text{SiCl}_x \qquad (1)$$

$$\text{TiSix} + \text{O}_2 \rightarrow \text{TiO}_x, \text{SiO}_x \qquad (2).$$

According to formulas (1) and (2), when the gas mixture including Cl$_2$ and O$_2$ is used as an etching gas to etch TiSix, chlorides (e.g., TiCl$_4$ and SiCl$_4$) and oxides (e.g., TiO and SiO) are produced as byproducts. The chlorides, such as TiCl$_4$ and SiCl$_4$, produced in formula (1) are volatilized during the etch. The non-volatile oxides, such as TiO and SiO, produced in formula (2), however, adhere to the sidewalls of the polycide structure during the etch and provide a protective layer so that sidewall erosion of the polycide structure can be reduced.

Figure 2:
FIG. 2 is a scanning electron microscope (SEM) photograph illustrating a gate electrode formed by etching a polycide structure using only chlorine gas Cl$_2$ according to the prior art.

FIGS. 2 and 3A to 3C are SEM photographs illustrating polycide gate structures formed using different dry etches. In FIG. 2, the TiSix layer is etched using only chlorine gas (Cl$_2$), and the TiSix and polysilicon layers are significantly eroded at the sidewalls thereof.

Figure 3A:
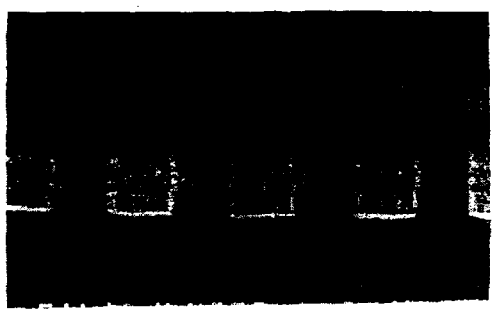
FIGS. 3A to 3C are SEM photographs illustrating gate electrodes formed using an etching gas mixture including oxygen gas O$_2$ to etch a polycide structure according to the present invention.
Figure 3B:
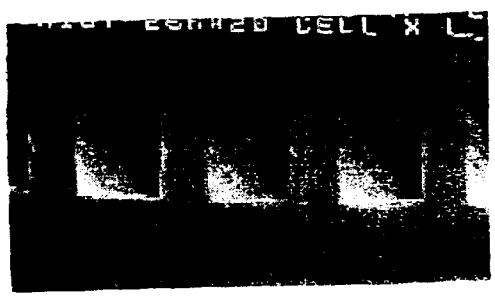
Figure 3C:
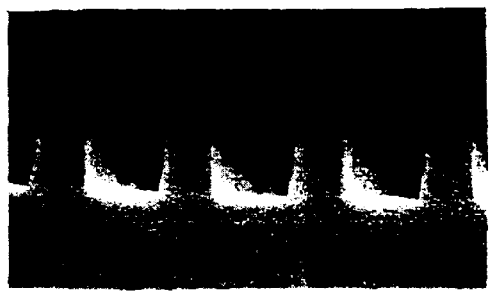

FIGS. 3A to 3C are SEM photographs of polycide gate structures formed when oxygen gas O$_2$ is added to the chlorine gas Cl$_2$ at respective ratios of 10%, 20%, and 30%, and the resulting gas mixture is used to etch the TiSix layer. As shown, the oxygen gas O$_2$ is preferably added at the ratio of approximately 20% to provide a polycide gate electrode structure having the most desirable profile. When the oxygen gas O$_2$ is added at a ratio of over 30%, the oxide polymer may be excessively produced causing a positive pattern profile and/or generating residues within a cell.

The determination of appropriate substrate temperatures and bias powers to be provided during the dry etch will now be discussed. In particular, temperatures and bias powers are desired which reduce sidewall erosion and which reduce the formation of residues along bottom surfaces of open areas when performing the dry etch using the gas mixture including Cl$_2$ and O$_2$.

Figure 4A:
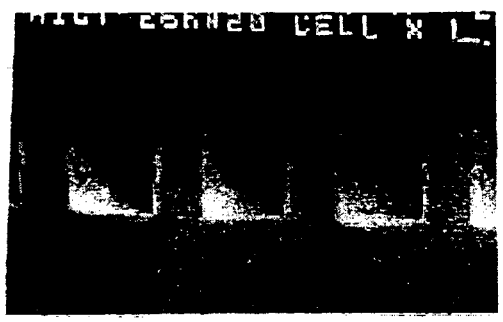
FIGS. 4A to 4C are SEM photographs illustrating gate electrodes formed by etching the polycide structure using a gas mixture including oxygen gas O$_2$ and chlorine gas Cl$_2$ at different temperatures according to the present invention.
Figure 4B:
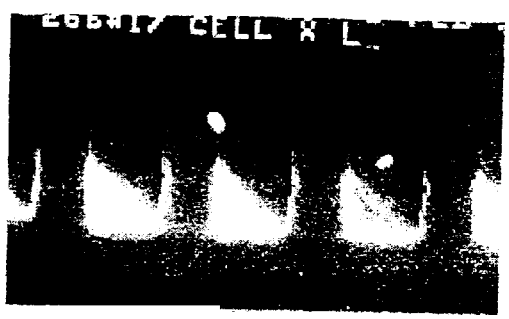
Figure 4C:

FIGS. 4A to 4C are SEM photographs of gate electrode patterns which have been dry etched at respective substrate temperatures of 0° C., −30° C., and −50° C. The polycide layer has been etched using the gas mixture including Cl$_2$ and O$_2$ wherein the oxygen gas O$_2$ is mixed at the ratio of 20%. As shown, an active reaction at the sidewalls is reduced as the temperature of the substrate decreases so that oxide byproducts such as TiO can serve as a protective layer. As shown in FIG. 4C, the sidewall erosion is significantly reduced. Residues may, however, be generated on the bottom surface of the pattern. The TiSix layer may not be completely etched because an etching selectivity between the polysilicon layer and the TiSix layer may decrease with a decrease in the temperature of the substrate. Accordingly, residues may result.

Figure 5:
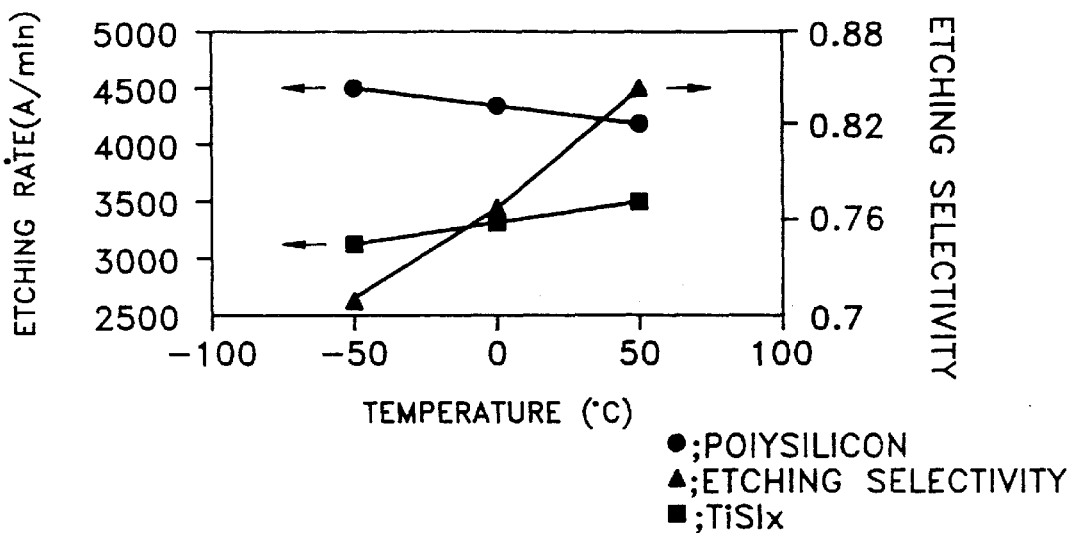
FIG. 5 is a graph illustrating etching rates of polysilicon and TiSix layers as a function of the temperature of the substrate according to the present invention.

FIG. 5 is a graph illustrating etching rates of the polysilicon layer and the TiSix layer versus the temperature of the substrate. FIG. 5 also illustrates an etching selectivity between the polysilicon layer and the TiSix layer within the substrate temperature range of −50° C. to 50° C. As shown, the etching selectivity between the two layers increases as the temperature of the substrate increases, and the increased selectivity favorably reduces the residues.

Figure 6:
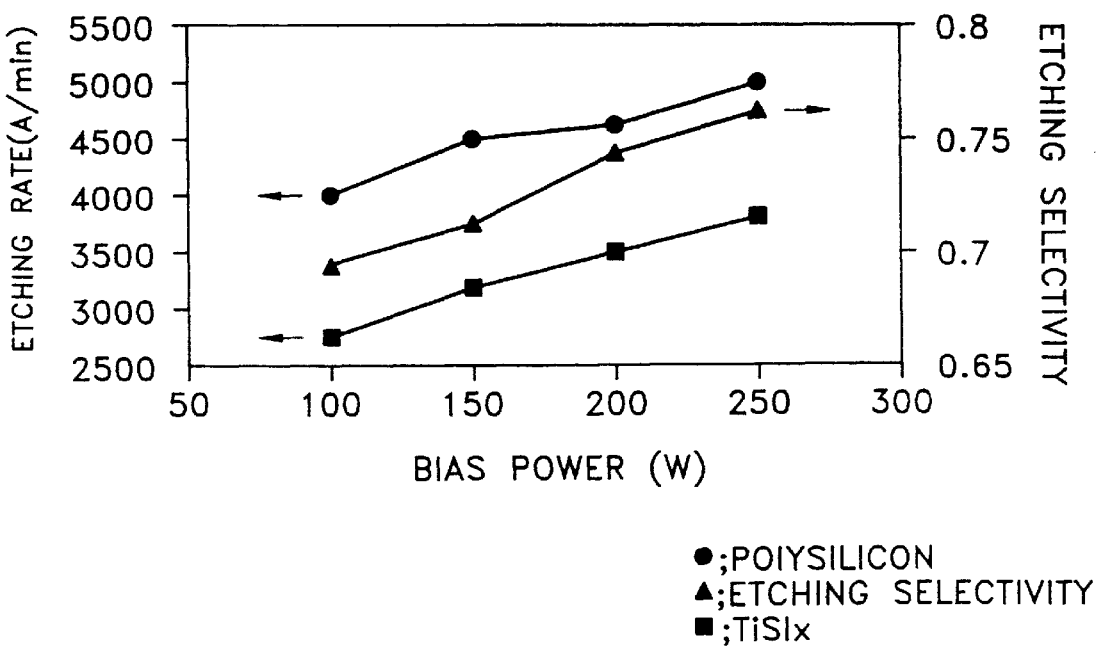
FIG. 6 is a graph illustrating etching rates of polysilicon and TiSix layers as a function of bias power according to the present invention.

Alternately, the residues generated at low substrate temperatures can be removed by applying an appropriate bias power thereto. FIG. 6 is a graph illustrating etching rates of the polysilicon and TiSix layers versus bias power. When an appropriate etching gas and an appropriate substrate temperature are provided, the etching selectivity between the polysilicon and TiSix films increases as the bias power increases.

Figure 7A:
FIGS. 7A to 7C are SEM photographs illustrating polycide gate structures formed according to the present invention.
Figure 7B:
Figure 7C:

FIGS. 7A to 7C are SEM photographs illustrating polycide gate structures formed using respective bias powers of 150 W, 200 W, and 250 W. The effectiveness of the residue removal can be observed at the different bias powers. The temperature of the substrates was maintained at −50° C., and a source power of 600 W was applied. Even though the temperature of the substrate was about −50° C., residues are almost nonexistent when a bias power of about 250 W is applied.

Figure 8A:
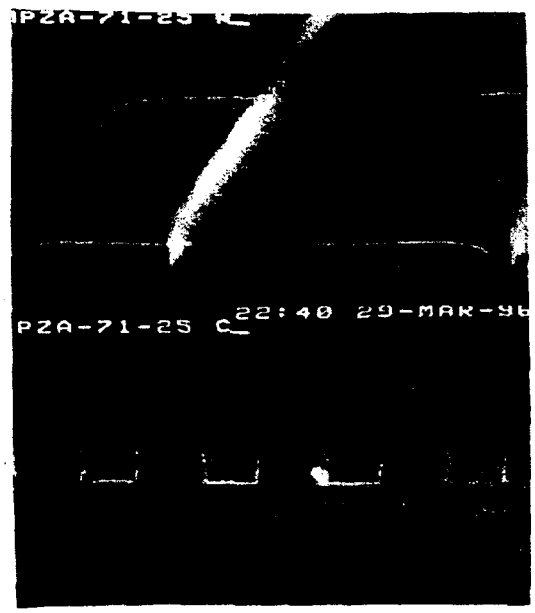
FIGS. 8A and 8B are SEM photographs illustrating gate electrodes formed using different etch temperatures and bias powers according to the present invention.
Figure 8B:
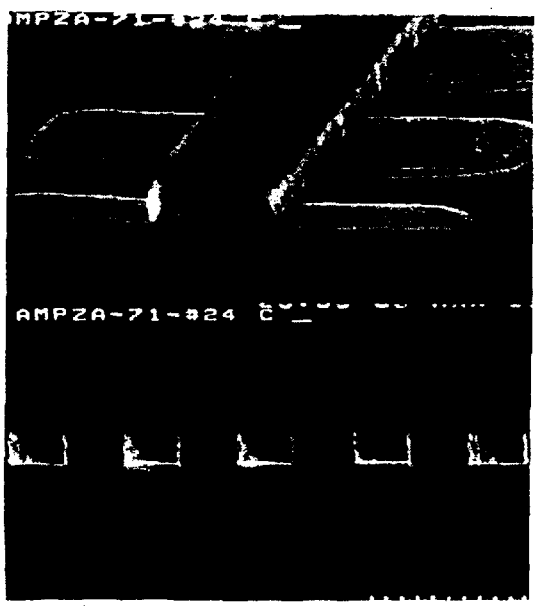

FIGS. 8A and 8B are SEM photographs illustrating profiles of the polycide gate structures formed using different substrate temperatures and bias powers during the dry etch. In FIG. 8A, the temperature of the substrate was maintained at 50° C., and a bias power of 150 W was applied. In FIG.

8B, the temperature of the substrate was maintained at −50° C., and a bias power of 200 W was applied. When the temperature of the substrate is maintained at 50° C., a good sidewall profile can be obtained and the residues can be removed if a bias power of 150 W is applied. When the temperature of the substrate is maintained at −50° C. during the dry etch, a good sidewall profile can be obtained if a bias power of 200 W is applied. A small amount of residue may, however, remain on the bottom surface of the polycide gate structure.

As described above, when $Cl_2$ and $O_2$ are mixed at an appropriate ratio and used as an etching gas, and when the temperature of the substrate is over 0° C. and the applied bias power is over 150 W, a good sidewall profile can be obtained and the generation of residues can be reduced. Even when the temperature of the substrate is below 0° C. during the dry etch, a good sidewall profile can be obtained and the residues can be reduced if the applied bias power is about 250 W.

If the polycide gate is applied to a highly-integrated memory device such as a 1 gigabit dynamic random access memory (DRAM), the polysilicon layer and gate oxide layer may be reduced in thickness to about 500 Å and tens of Å in thickness, respectively. If a higher bias power is applied when etching the TiSix layer, a pitting can thus be generated on the gate oxide layer. Because the gate oxide and polysilicon layers become thinner with an increase in the integration of a device and because pitting may occur on the gate oxide layer, it may be advantageous to etch the structure at a relatively high substrate temperature allowing a relatively wide margin for the bias power. A small amount of erosion occurring under the conditions discussed above can be remedied through the adjustment of other process conditions.

According to the methods of the present invention for forming a gate electrode having a polycide structure, a gas mixture including a desired ratio of $Cl_2$ and $O_2$ can be used as an etching gas for dry etching a silicide layer. By maintaining the temperature of the substrate at a desired level, an etching byproduct can adhere to the sidewalls of the polycide gate structure to form a protective film. Accordingly, sidewall erosion of the polycide gate structure can be reduced during etching. Residues can also be reduced by applying a sufficient bias power.

Even though the silicide is discussed as being titanium silicide throughout the detailed description, it will be apparent that various changes can be effected by those skilled in the art within the technical spirit of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a gate structure on a semiconductor substrate, said method comprising the steps of:
    forming a layer of a gate material on the semiconductor substrate wherein said step of forming said layer of said gate material comprises forming a silicide layer;
    forming a patterned mask layer on said layer of said gate material opposite the substrate; and
    etching said layer of said gate material including said silicide layer with an etching gas including a mixture of chlorine gas ($Cl_2$) and oxygen gas ($O_2$) using said patterned mask layer as an etching mask so that said silicide layer is etched with said etching gas including said mixture of chlorine gas ($Cl_2$) and oxygen gas ($O_2$) wherein a temperature of the semiconductor substrate is maintained to be in the range of −50° C. to 0° C. and a bias power is applied in the range of 200 W to 250 W and wherein the relation of the temperature of the semiconductor substrate and the bias power is provided such that the bias power is increased as the temperature of the semiconductor substrate decreases.

2. A method according to claim 1 wherein said step of forming said layer of said gate material further comprises forming a polysilicon layer on a surface of the semiconductor substrate so that said silicide layer is on said polysilicon layer opposite the substrate.

3. A method according to claim 1 wherein said oxygen gas ($O_2$) is mixed at a ratio of 10% to 30% of said etching gas.

4. A method according to claim 1 wherein said step of forming said layer of said gate material is preceded by the step of forming an insulating layer on the substrate.

5. A method for patterning a layer on a substrate, said method comprising the steps of:
    forming a layer of a material to be patterned on the semiconductor substrate wherein said step of forming said layer of said material to be patterned comprises forming a silicide layer;
    forming a patterned mask layer on said layer of said gate material opposite the substrate; and
    etching said layer of said gate material including said silicide layer with an etching gas including a mixture of chlorine gas ($Cl_2$) and oxygen gas ($O_2$) using said patterned mask layer as an etching mask so that said silicide layer is etched with said etching gas including said mixture of chlorine gas ($Cl_2$) and oxygen gas ($O_2$), wherein a temperature of the semiconductor substrate is maintained to be in the range of −50° C. to 0° C. and a bias power is applied in the range of 200 W to 250 W and wherein the relation of the temperature of the semiconductor substrate and the bias power is provided such that the bias power is increased as the temperature of the semiconductor substrate decreases.

6. A method according to claim 5 wherein said step of forming said layer of said material to be patterned further comprises forming a polysilicon layer on a surface of the substrate so that said silicide layer is on said polysilicon layer opposite the substrate.

7. A method according to claim 5 wherein said oxygen gas ($O_2$) is mixed at a ratio of 10% to 30% of said etching gas.

8. A method according to claim 5 wherein said step of forming said layer of said material to be patterned is preceded by the step of forming an insulating layer on the substrate.

9. A method for forming a gate on an integrated circuit substrate, said method comprising the steps of:
    forming a polysilicon layer on a surface of the substrate;
    forming a silicide layer on said polysilicon layer opposite the substrate;
    forming a patterned mask layer on said suicide layer opposite said substrate; and
    etching said suicide layer with an etching gas including a mixture of chlorine gas ($Cl_2$) and oxygen gas ($O_2$) using said patterned mask layer as an etching mask, wherein a temperature of the substrate is maintained to be in the range of −50° C. to 0° C. and a bias power is applied in the range of 200 W to 250 W and wherein the relation of the temperature of the substrate and the bias power is provided such that the bias power is increased as the temperature of the substrate decreases.

10. A method according to claim 9 wherein said oxygen gas ($O_2$) is mixed at a ratio of 10% to 30% of said etching gas.

* * * * *